United States Patent
Kawazu (10) Patent No.: US 9,462,709 B2
(45) Date of Patent: Oct. 4, 2016

(54) ELEMENT HOUSING PACKAGE AND MOUNTING STRUCTURE BODY

(71) Applicant: KYOCERA Corporation, Kyoto-shi, Kyoto (JP)

(72) Inventor: Yoshiki Kawazu, Kyoto (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 147 days.

(21) Appl. No.: 14/407,557

(22) PCT Filed: Sep. 26, 2013

(86) PCT No.: PCT/JP2013/075993
§ 371 (c)(1),
(2) Date: Dec. 12, 2014

(87) PCT Pub. No.: WO2014/069126
PCT Pub. Date: May 8, 2014

(65) Prior Publication Data
US 2015/0173214 A1    Jun. 18, 2015

(30) Foreign Application Priority Data

Oct. 29, 2012  (JP) .................................. 2012-237399
Jun. 25, 2013  (JP) .................................. 2013-132608

(51) Int. Cl.
*H01L 23/055* (2006.01)
*H05K 1/18* (2006.01)
(Continued)

(52) U.S. Cl.
CPC ........... *H05K 5/0091* (2013.01); *H01L 23/055* (2013.01); *H05K 1/0225* (2013.01);
(Continued)

(58) Field of Classification Search
CPC .. H01L 23/055; H05K 1/181; H05K 5/0247; H05K 1/0225
See application file for complete search history.

(56) References Cited

U.S. PATENT DOCUMENTS 4,890,155 A * 12/1989 Miyagawa .............. H01L 23/66 174/524
6,043,556 A *  3/2000 Tomie ..................... H01L 23/66 257/664

(Continued)

FOREIGN PATENT DOCUMENTS

JP          5-160605 A    6/1993
JP           6-21253 A    1/1994

(Continued)

OTHER PUBLICATIONS

International Search Report, PCT/JP2013/075993, Dec. 4, 2013, 2 pgs.

*Primary Examiner* — Jeremy C Norris
*Assistant Examiner* — Nathan Milakovich
(74) *Attorney, Agent, or Firm* — Volpe and Koenig, P.C.

(57) ABSTRACT

An element housing package includes a substrate, a frame body, and an input-output terminal. The input-output terminal has a wiring conductor formed in a stacked body consisting of dielectric layers and ground layers which are alternately laminated, to extend through an inside of the stacked body, and a lead terminal connected to the wiring conductor. A non-formation region is provided in the ground layers around the wiring conductor, which passes through the inside of the input-output terminal in a vertical direction of the stacked body. The non-formation region has, in order from an upper side toward a lower side, a first non-formation section, a second non-formation section having an area smaller than that of the first non-formation section, and a third non-formation section having an area larger than that of the second non-formation section.

10 Claims, 9 Drawing Sheets

(51) Int. Cl.
    *H05K 5/02*             (2006.01)
    *H05K 5/00*             (2006.01)
    *H05K 1/02*             (2006.01)
    *H05K 1/11*             (2006.01)

(52) U.S. Cl.
    CPC ............. *H05K 1/115* (2013.01); *H05K 1/181* (2013.01); *H05K 5/0239* (2013.01); *H05K 5/0247* (2013.01); *H01L 2924/0002* (2013.01); *H05K 1/116* (2013.01); *H05K 2201/093* (2013.01); *H05K 2201/09627* (2013.01); *H05K 2201/09718* (2013.01); *H05K 2201/2018* (2013.01)

(56) References Cited

U.S. PATENT DOCUMENTS

| | | | |
|---|---|---|---|
| 6,215,377 B1 * | 4/2001 | Douriet | H01L 23/49805 257/728 |
| 6,712,284 B2 * | 3/2004 | Aoki | H01L 23/552 257/183 |
| 8,310,837 B2 * | 11/2012 | Kawano | H04B 3/54 361/761 |
| 8,344,259 B2 * | 1/2013 | Tsujino | H01L 23/057 174/255 |
| 8,653,649 B2 * | 2/2014 | Tsujino | H01L 23/057 257/664 |
| 2011/0048796 A1 * | 3/2011 | Tsujino | H01L 23/49833 174/549 |
| 2014/0262469 A1 * | 9/2014 | Hettler | H05K 1/0222 174/262 |
| 2015/0195935 A1 * | 7/2015 | Shibayama | H05K 5/0247 361/807 |

FOREIGN PATENT DOCUMENTS

| | | |
|---|---|---|
| JP | 2004-153165 A | 5/2004 |
| JP | 2005-072503 A | 3/2005 |

* cited by examiner

ELEMENT HOUSING PACKAGE AND MOUNTING STRUCTURE BODY

TECHNICAL FIELD

The present invention relates to an element housing package capable of mounting an element and a mounting structure body on which an element is mounted.

BACKGROUND ART

In recent years, along with miniaturization of devices, a compact element housing package capable of mounting an element such as a semiconductor element, a light emitting diode, a piezoelectric element, a crystal resonator, a laser diode, or a photodiode has been developed (for example, see Japanese Unexamined Patent Publication JP-A 2004-153165). Moreover, the element housing package suggested in JP-A 2004-153165 includes a substrate, a frame body disposed on the substrate, and an input-output terminal provided in a part of the frame body, and a lead terminal which is attached to an upper surface of the input-output terminal and electrically connects an inside of the frame body and an outside of the frame body.

Specifically, in a high frequency element housing package using a high frequency for optical communication, microwave communication, millimeter-wave communication, or the like, there is a problem in that control of the high frequency is difficult and high frequency circuit design is difficult as a frequency band becomes high.

The invention is devised in view of the above problem, and an object thereof is to provide an element housing package capable of achieving favorable frequency characteristics in a high frequency band, and a mounting structure body.

SUMMARY OF INVENTION

An element housing package according to an embodiment of the invention includes: a substrate having a mounting region for mounting an element on an upper surface thereof; a frame body having a frame section disposed on the substrate so as to surround the mounting region along an outer periphery of the substrate, the frame section being provided with a penetrating section formed in a direction which is along the upper surface of the substrate; and an input-output terminal disposed in the penetrating section and electrically connecting an inside of the frame body and an outside of the frame body. The input-output terminal has a wiring conductor formed in a stacked body consisting of a plurality of dielectric layers and a plurality of ground layers which are alternately laminated, so as to extend from a part of an upper surface of the stacked body which is positioned inside the frame body, through an inside of the stacked body, to a part of a lower surface thereof which is positioned outside the frame body, and a lead terminal connected to the wiring conductor in the lower surface of the stacked body. Furthermore, a non-formation region is provided in at least three ground layers around the wiring conductor, which passes through in a vertical direction of the stacked body. The non-formation region has, in order from an upper side toward a lower side of the stacked body, a first non-formation section, a second non-formation section having an area smaller than that of the first non-formation section, and a third non-formation section having an area larger than that of the second non-formation section.

Furthermore, a mounting structure body according to an embodiment of the invention includes the element housing package and an element mounted on the mounting region of the element housing package.

DESCRIPTION OF EMBODIMENTS

<Configuration of Mounting Structure Body>

Figure 1:
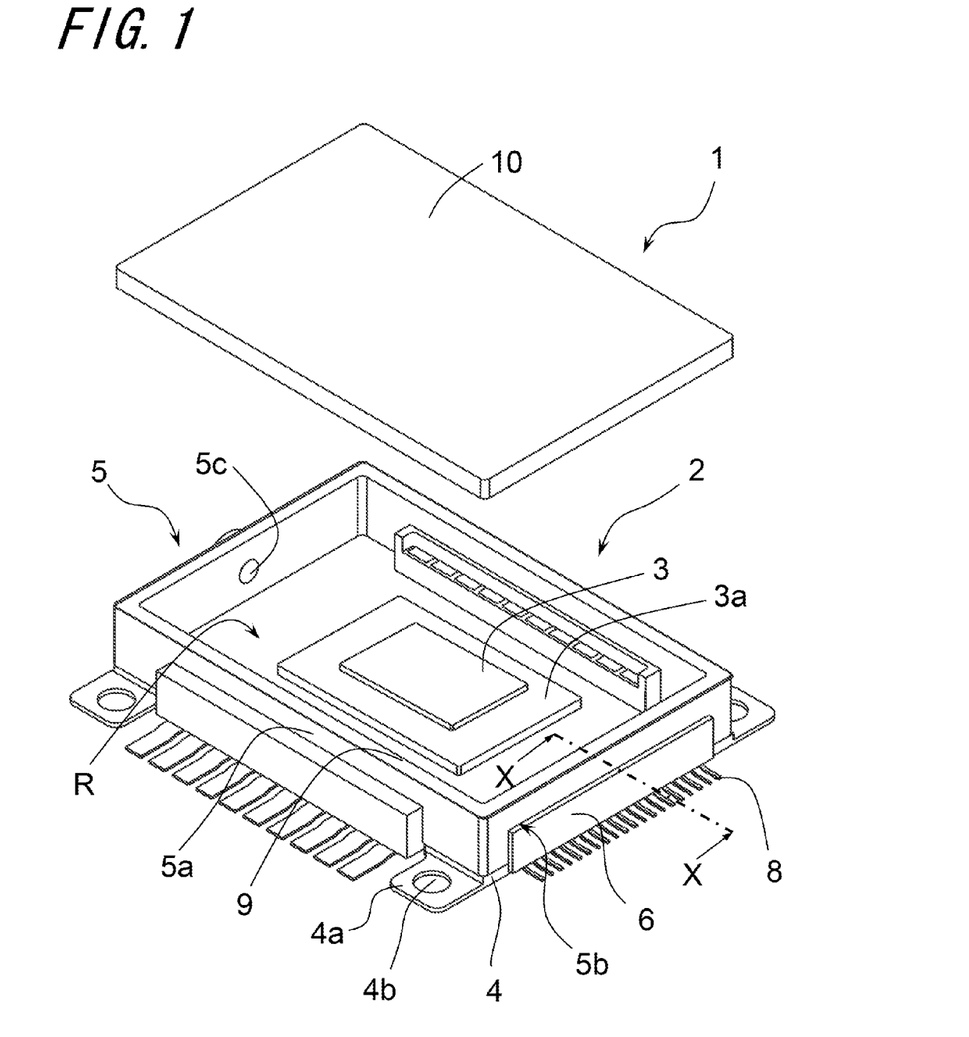
FIG. 1 is a schematic perspective view of a mounting structure body according to an embodiment of the invention when viewed in one direction.
Figure 2:
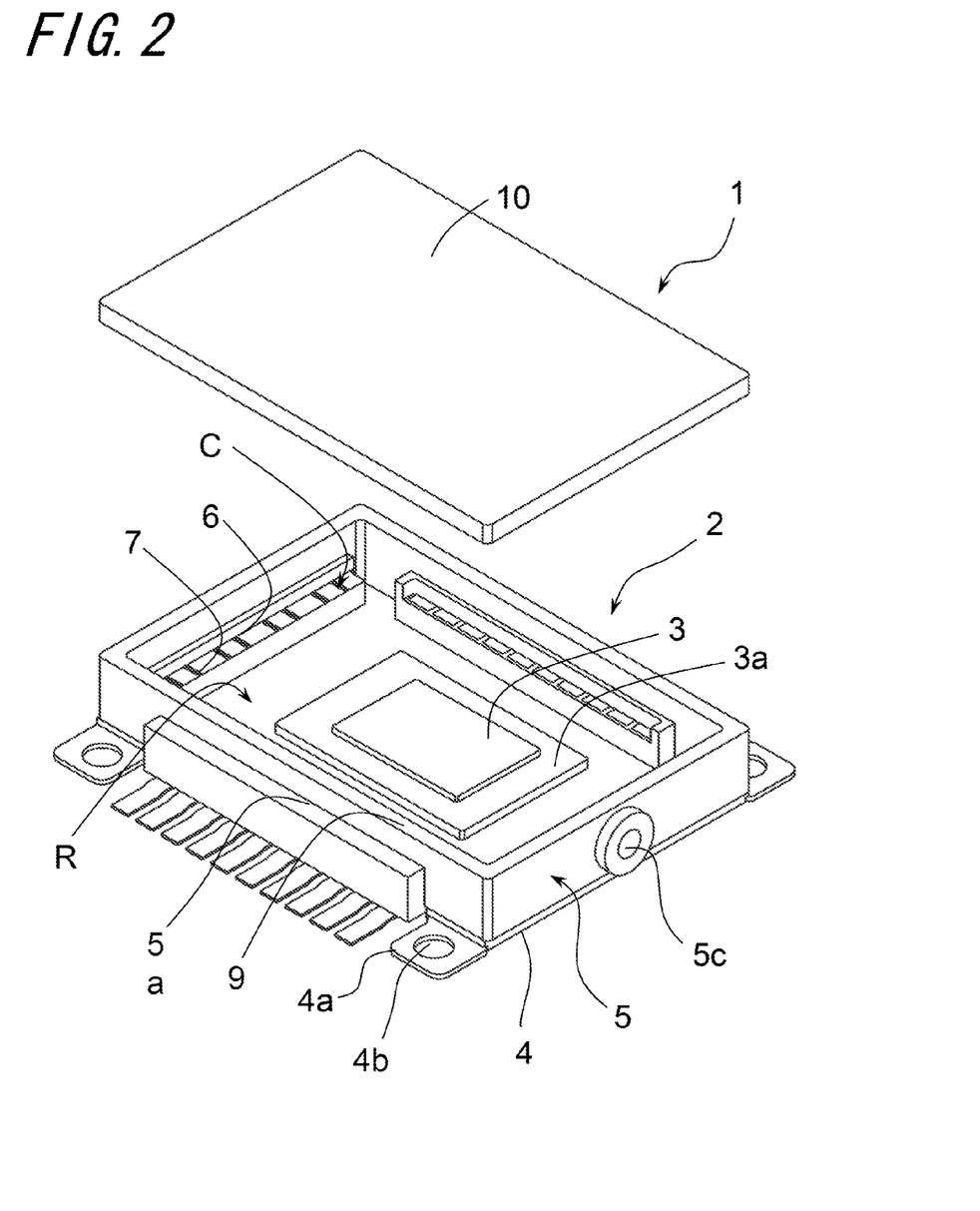
FIG. 2 is a schematic perspective view of the mounting structure body according to the embodiment of the invention when viewed in another direction.

As illustrated in FIG. 1 and FIG. 2, a mounting structure body 1 includes an element housing package 2 and an element 3 disposed in a mounting region R of the element housing package 2. For example, the element housing package 2 is used for mounting the element 3 formed of an active element such as a semiconductor element, a transistor, a laser diode, a photodiode, or a thyristor, or a passive element such as a resister, a capacitor, a solar cell, a piezoelectric element, a crystal oscillator or a ceramic oscillator.

The element housing package 2 includes a substrate 4 having the mounting region R for mounting the element 3 on an upper surface thereof; a frame body 5 having a frame section 5a disposed on the substrate 4 so as to surround the mounting region R along an outer periphery of the substrate 4, the frame section 5a being provided with a penetrating section 5b formed in a planar direction which is along the upper surface of the substrate 4; and an input-output terminal 6 disposed in the penetrating section 5b and electrically connecting an inside of the frame body 5 and an outside of the frame body 5.

The element 3 is mounted on a seat 3a. The seat 3a is provided in the mounting region R inside of the element housing package 2. The seat 3a mounts the element 3 and can adjust a height position of the element 3. The seat 3a is formed of an insulation material, and on an upper surface of the seat 3a, an electric wiring electrically connected to the element 3 is formed.

The element housing package 2 is suitable to mount and operate the element that supports a high breakdown voltage, a large current, a high power, or a high speed and high frequency, and mounts the semiconductor element as an example of the element 3. Furthermore, the element housing package 2 includes the substrate 4 having the mounting region R for mounting the element 3 on the upper surface thereof; the frame body 5 having the frame section 5a disposed on the substrate 4 so as to surround the mounting region R along the outer periphery of the substrate 4, the frame section 5a being provided with the penetrating section 5b formed in the planar direction which is along the upper surface of the substrate 4; and the input-output terminal 6 disposed in the penetrating section 5b and electrically connecting the inside of the frame body 5 and the outside of the frame body 5.

The substrate 4 is a rectangular metal plate and is, for example, made of a metal material such as copper, iron, tungsten, molybdenum, nickel, or cobalt, or an alloy containing these metal materials. Moreover, thermal conductivity of the substrate 4 is, for example, set to be 15 W/(m·K) or more and 450 W/(m·K) or less. The thermal expansion coefficient of the substrate 4 is, for example, set to be $3 \times 10^{-6}$/K or more and $28 \times 10^{-6}$/K or less.

Extension sections 4a extending outwardly and screw holes 4b for screwing an external substrate to the extension sections 4a are formed in four corners of the substrate 4. Moreover, the substrate 4 is fixed to the external substrate by inserting screws or bolts into the screw holes 4b.

The substrate 4 is produced in a predetermined shape by performing a metal processing method such as rolling or punching which is known with respect to an ingot made by casting and solidifying a molten metal material in a mold. Moreover, a length of one side of the substrate 4 in a plan view thereof is, for example, set to be 5 mm or more and 50 mm or less excluding the extension sections 4a. Furthermore, a thickness of the substrate 4 in a vertical direction thereof is, for example, set to be 0.3 mm or more and 5 mm or less.

Furthermore, in order to prevent oxidation corrosion, a metal layer of nickel, gold or the like is formed on a surface of the substrate 4 using electroplating or electroless plating. Moreover, a thickness of the metal layer is, for example, set to be 0.5 μm or more and 9 μm or less.

The frame body 5 is disposed on the substrate 4 along the outer periphery of the substrate 4. The frame body 5 has the frame section 5a surrounding the mounting region R of the substrate 4, the frame section 5a being provided with the penetrating section 5b formed in the planar direction which is along the upper surface of the substrate 4. Three sides among four sides of the frame section 5a are cut out. Then, the input-output terminals 6 are provided in the cut-out portions. The frame body 5 is bonded on the substrate 4 by a brazing material such as a silver-copper brazing material.

The frame body 5 is, for example, made of a metal material such as copper, iron, tungsten, molybdenum, nickel, or cobalt, or an alloy containing these metal materials. The frame body 5 has a function of efficiently radiating the heat generated from the element 3 to the outside or a function of absorbing or distributing thermal stress. Moreover, the thermal conductivity of the frame body 5 is, for example, set to be 15 W/(m·K) or more and 450 W/(m·K) or less. The thermal expansion coefficient of the frame body 5 is, for example, set to be $3 \times 10^{-6}$/K or more and $28 \times 10^{-6}$/K or less.

Furthermore, a thickness of the frame body 5 in a vertical direction thereof is, for example, set to be 5 mm or more and 20 mm or less. Furthermore, a thickness of the frame is, for example, set to be 0.5 mm or more and 3 mm or less when the frame body 5 is viewed in a plan view thereof.

A light-permeable member 5c through which light from optical fiber provided on the outside passes to a region surrounded by the frame body 5 is disposed on one side of side surfaces of the frame body 5. For example, the light-permeable member 5c is formed of a light-transmitting material such as plastic, glass, or sapphire.

Figure 3:
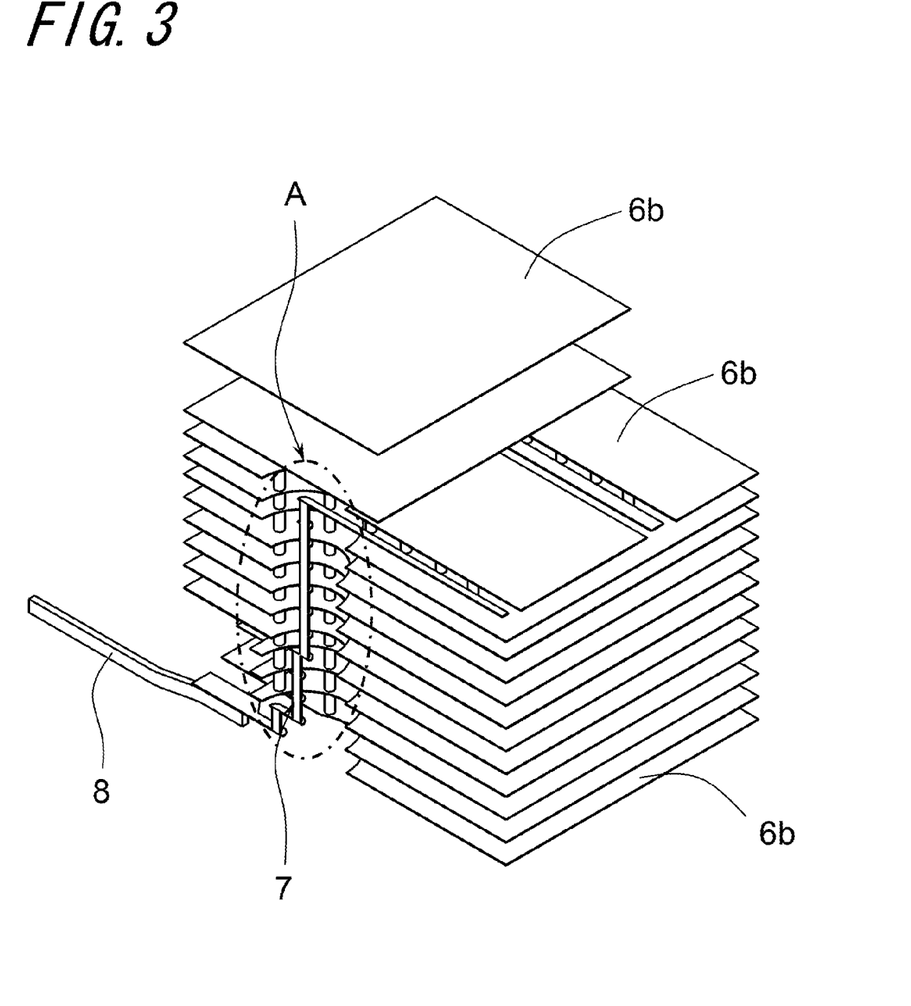
FIG. 3 is a schematic perspective view illustrating a part of an inside of an input-output terminal taken along the line X-X in FIG. 1, which illustrates a plurality of ground layers, a wiring conductor, and a lead terminal.

As illustrated in FIG. 3, the input-output terminal 6 is disposed in an edge of the substrate 4 and can electrically connect the inside of the frame body 5 and the outside of the frame body 5. The input-output terminal 6 is a stacked body consisting of a plurality of dielectric layers 6a and a plurality of ground layers 6b formed in a part of the upper surface or the lower surface of the plurality of dielectric layers 6a which are alternately laminated. The dielectric layer 6a is formed of a ceramic material which is an insulation material such as an aluminum oxide sintered body, a mullite sintered body, a silicon carbide sintered body, an aluminum nitride sintered body, a silicon nitride sintered body, or glass ceramics. Moreover, a relative permittivity of the dielectric layer 6a is, for example, 4.7 or more and 9.9 or less. Furthermore, the ground layer 6b is formed of a conductive material and is, for example, formed of a metal material such as copper, iron, tungsten, molybdenum, nickel, or cobalt, or an alloy containing these metal materials.

A notch C is present in a portion of the input-output terminal 6 inside the frame body 5, and the input-output terminal 6 includes a wiring conductor 7 extending from the inside of the notch C, through the inside of the input-output terminal 6, to a lower surface thereof, and a lead terminal 8 connected to the wiring conductor 7 in the lower surface of the input-output terminal 6. Moreover, the wiring conductor 7 is electrically insulated from the plurality of ground layers 6b. Moreover, the input-output terminal 6 is provided with the notch C formed on the side surface positioned inside the frame body 5 from an upper surface of the input-output terminal 6.

The input-output terminal 6 can be formed by laminating a plurality of layers. Here, a manufacturing method of the input-output terminal 6 will be described. For example, if the input-output terminal 6 is configured of the aluminum oxide sintered body, a mixture is obtained by adding and mixing an organic binder, a plasticizer, a solvent and so on into a raw material powder of aluminum oxide, silicon oxide, magnesium oxide, calcium oxide, and so on. Then, a green sheet formed in a sheet shape is obtained.

Furthermore, high melting point metal powder of tungsten, molybdenum, or the like that is a raw material of the ground layer 6b and the wiring conductor 7 is prepared, and a metal paste is obtained by adding and mixing an organic binder, a plasticizer, solvent, and so on into the powder. Then, an unfired green sheet is molded into a predetermined shape, and the metal paste is printed in predetermined portions.

Then, a plurality of green sheets on which the metal paste is printed are laminated and are fired simultaneously at a predetermined temperature and thereby the integrally-formed input-output terminal 6 is obtained. Furthermore, the lead terminal 8 is connected to the wiring conductor 7 and the ground layer 6b formed on the lower surface of the input-output terminal 6 through a brazing material.

The lead terminal 8 is a member configured to electrically connect an external electronic apparatus or the like and the element 3. The lead terminal 8 is connected to the wiring conductor 7 and the around layer 6b formed on the lower surface of the input-output terminal 6 through the brazing material. Then, the wiring conductor 7 and the ground layer 6b are electrically connected to the lead terminal 8. Furthermore, a plurality of wiring conductors 7 and a ground layer 6b are formed on the lower surface of the input-output terminal 6. The plurality of wiring conductors 7 are provided having spaces therebetween, or the ground layer 6b is disposed between the plurality of wiring conductors 7. Then, the wiring conductors 7 adjacent to each other are electrically insulated. Then, the lead terminals 8 adjacent to each other are electrically insulated by providing each lead terminal 8 in each of the wiring conductor 7 and the ground layer 6b. The lead terminal 8 is formed of a conductive material and is, for example, formed of a metal material such as copper, iron, tungsten, molybdenum, nickel, or cobalt, or alloy including these metal materials.

The lead terminal 8 extends along the planar direction in a side view thereof, and a portion between one end of the lead terminal 8 and the other end of the lead terminal 8 is bent. The lead terminal 8 is bent for adjustment so that a height position of the lower surface of the lead terminal 8 is equal to a height position of the lower surface of the substrate 4. Then, it is possible to flatly mount both of the substrate 4 and the lead terminal 8 with respect to an external substrate. Then, the element housing package 2 can be connected to the external substrate so as not to be inclined with respect to the external substrate while increasing an area in which the element housing package 2 is fixed to the external substrate. As a result, the element housing package 2 can be electrically connected firmly and stably to the external substrate.

Figure 4:
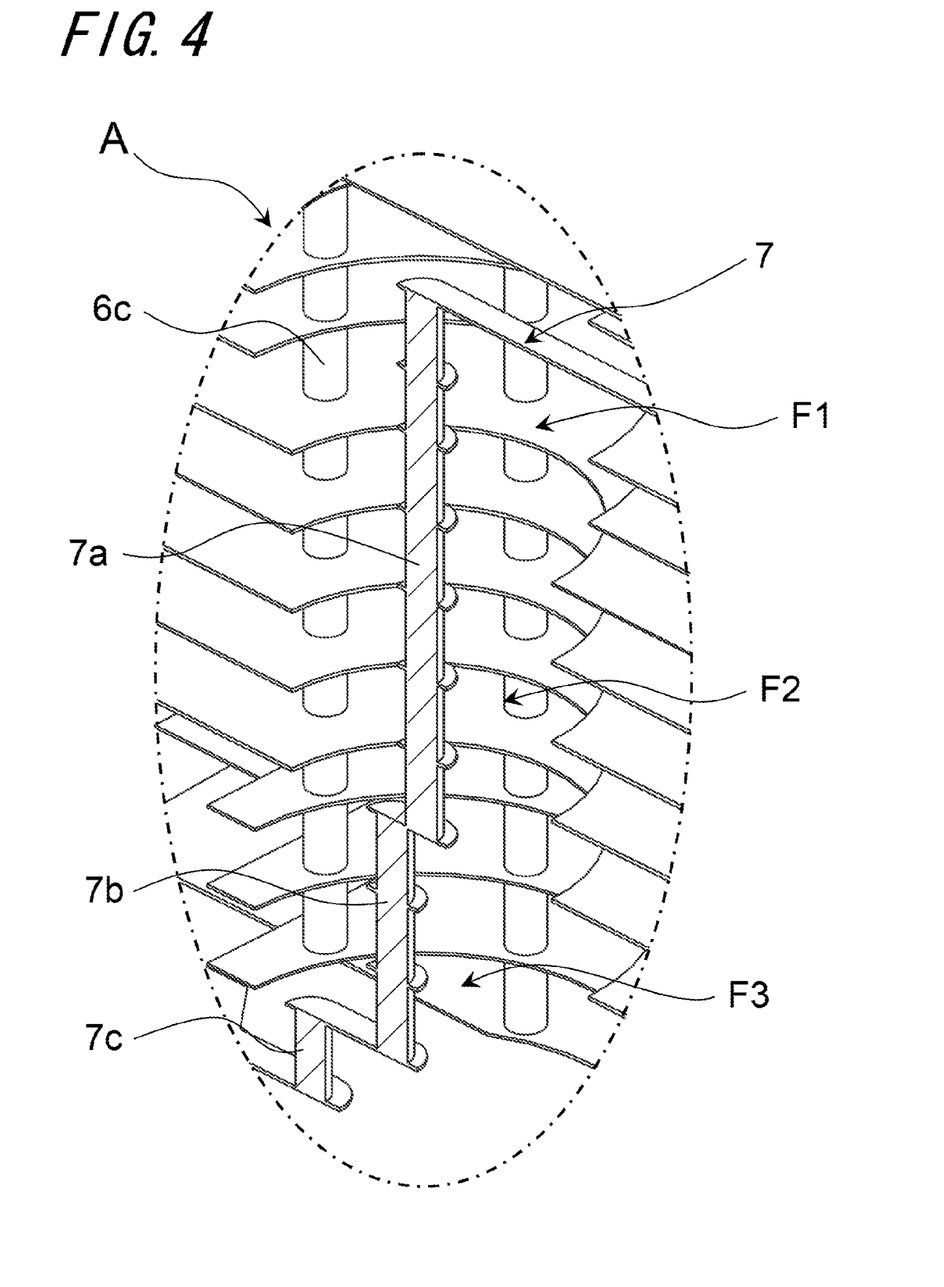
FIG. 4 is a partial enlarged view enlarging a part A in FIG. 3.
Figure 5:
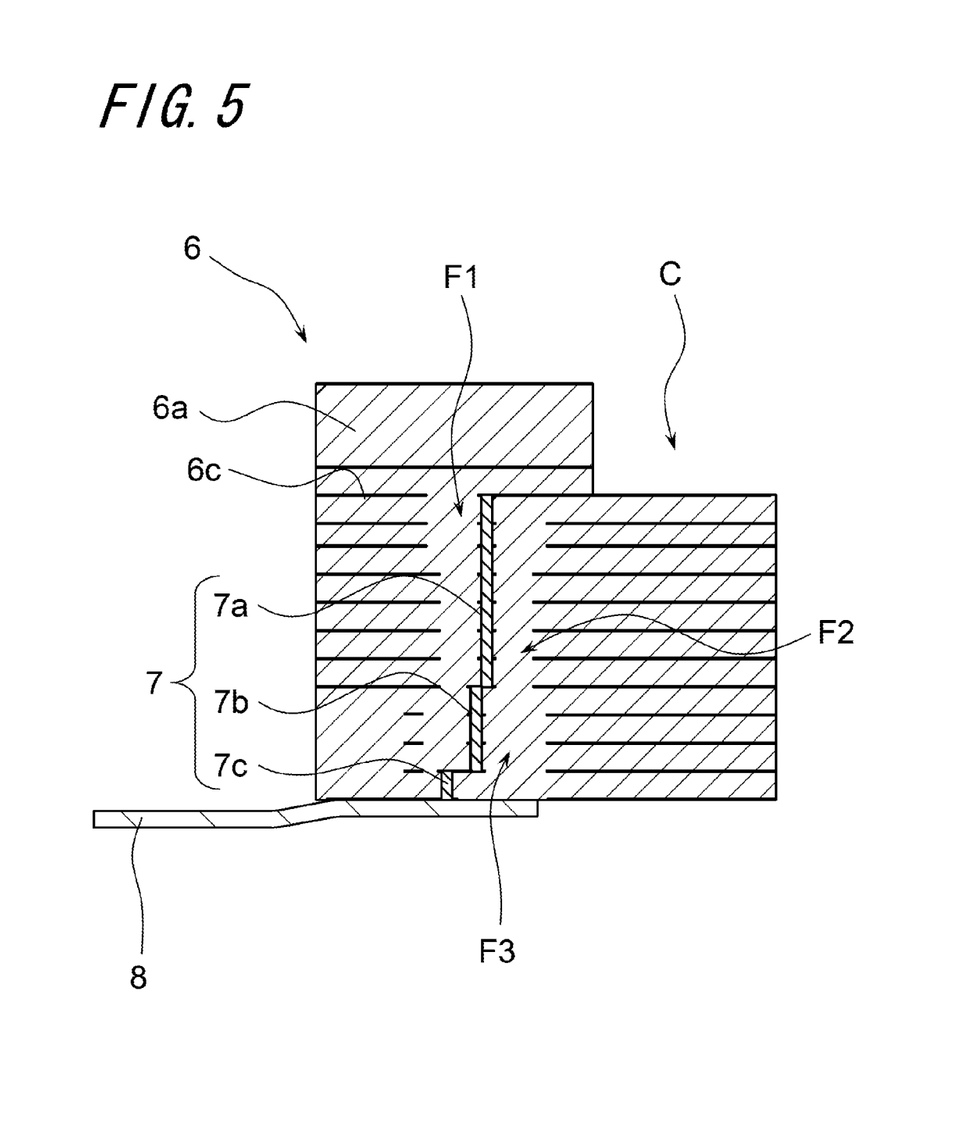
FIG. 5 is a cross-sectional view of the input-output terminal taken along the line X-X in FIG. 1.

At least three ground layers 6b each have a circular non-formation region in a plan view thereof, and a part of the wiring conductor 7 passing through the inside of the input-output terminal 6 in a vertical direction thereof is provided in the non-formation region. The non-formation region includes, in order from the upper side toward the lower side of the stacked body, a first non-formation section F1, a second non-formation section having an area smaller than that of the first non-formation section, and a third non-formation section having an area larger than that of the second non-formation section F2. The plurality of ground layers 6b are set to have the same electric potential through a via-conductor 6c. Moreover, the via-conductor 6c is provided inside the dielectric layer 6a that is positioned between the ground layers 6b whose vertical positions are different from each other, and connects the ground layer 6b positioned on an upper side thereof and the ground layer 6b positioned on a lower side thereof.

Figure 6:
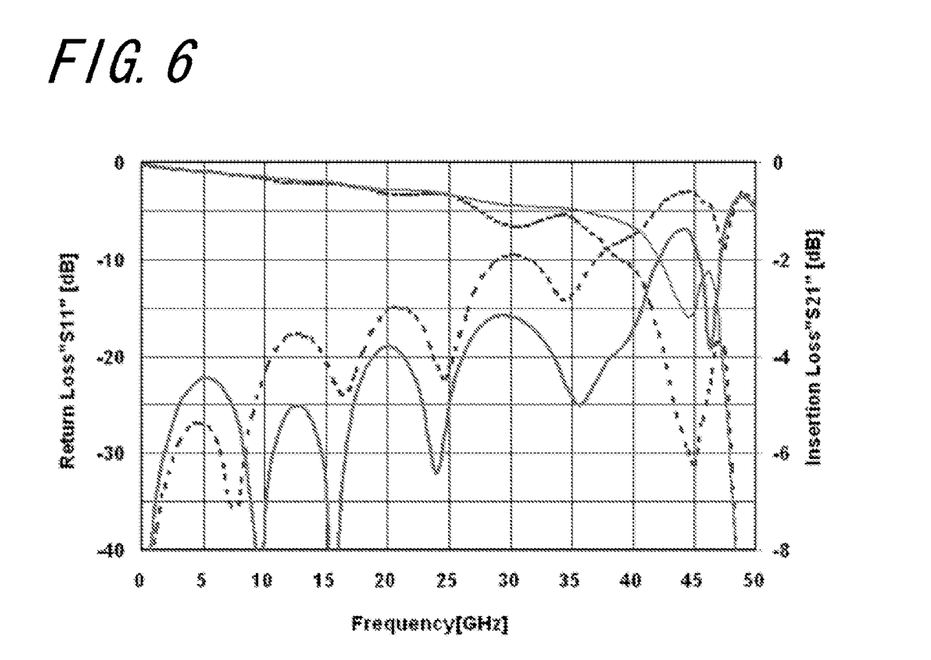
FIG. 6 is a graph illustrating frequency characteristics of the mounting structure body according to the embodiment of the invention.

FIG. 6 is a graph illustrating simulation results of frequency characteristics (S parameters) (Return Loss "S11" and Insertion Loss "S21") of the mounting structure body 1 according to the embodiment. The frequency characteristics of the first embodiment are indicated by a solid line and those of a comparative example are indicated by a broken line. Moreover, the comparative example has a structure in which a ground layer in which the non-formation region is not changed is provided around the wiring conductor extending straight in the vertical direction inside the input-output terminal 6. The return loss approaches 0 dB as the frequency becomes a high frequency from 0 GHz. Furthermore, the insertion loss is 0 dB when the frequency is 0 GHz, and deviation thereof from 0 dB gradually increases as the frequency becomes a high frequency. Then, a frequency at which the insertion loss begins to be greatly deviated from 0 dB is a so-called resonance frequency.

Figure 7:
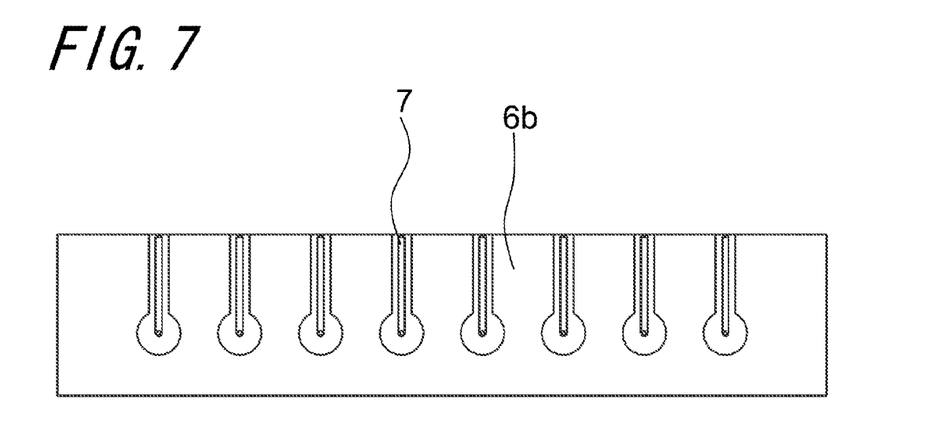
FIG. 7 is a plan view illustrating a relationship between the wiring conductor and the ground layer.
Figure 8:
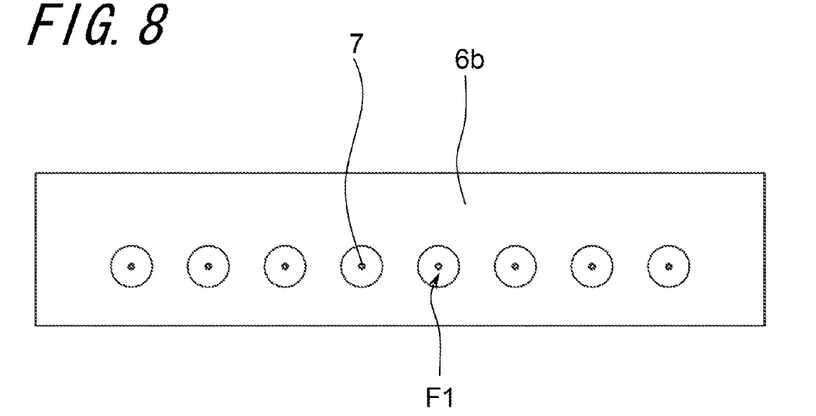
FIG. 8 is a plan view illustrating a relationship between the wiring conductor and the ground layer.
Figure 9:
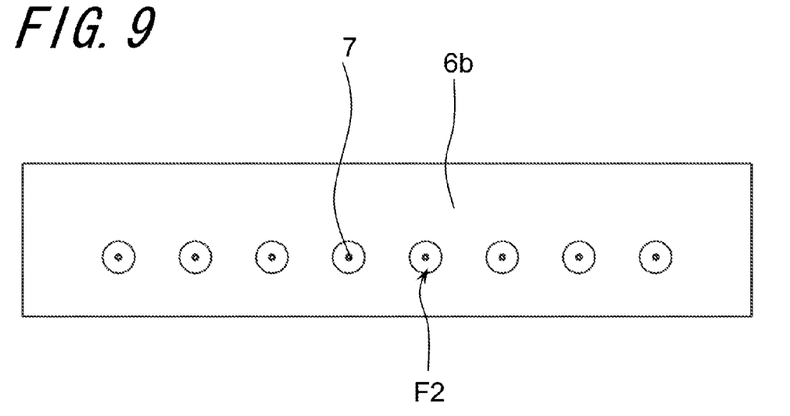
FIG. 9 is a plan view illustrating a relationship between the wiring conductor and the ground layer.
Figure 10:
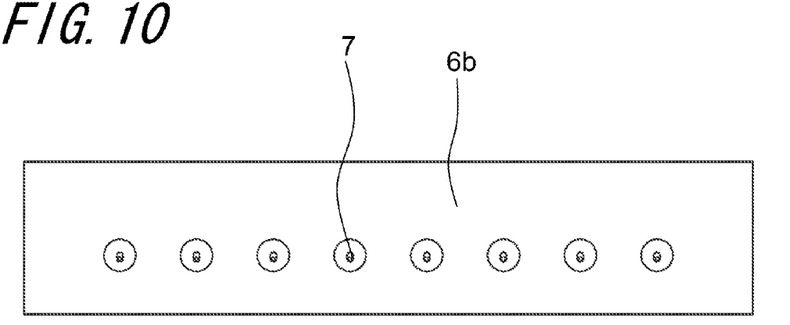
FIG. 10 is a plan view illustrating a relationship between the wiring conductor and the ground layer.
Figure 11:
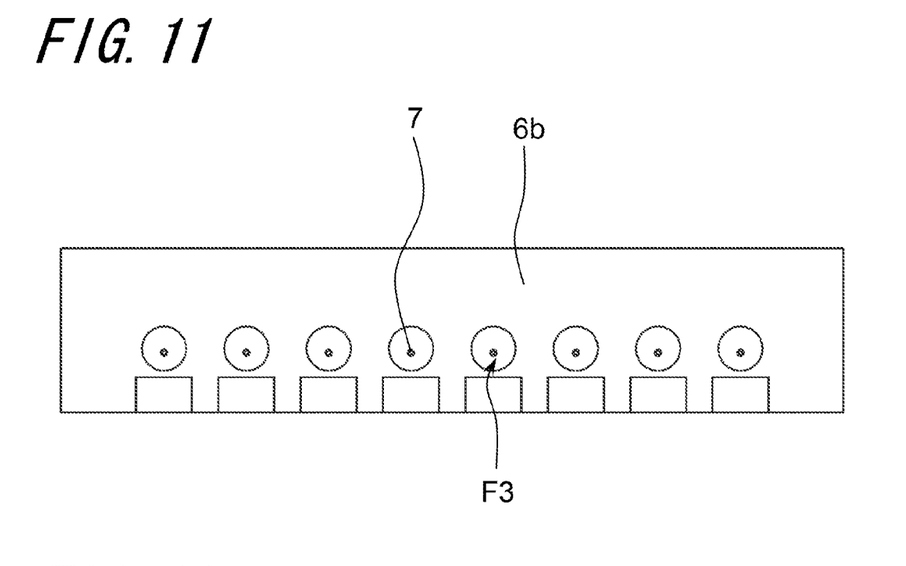
FIG. 11 is a plan view illustrating a relationship between the wiring conductor and the ground layer.
Figure 12:
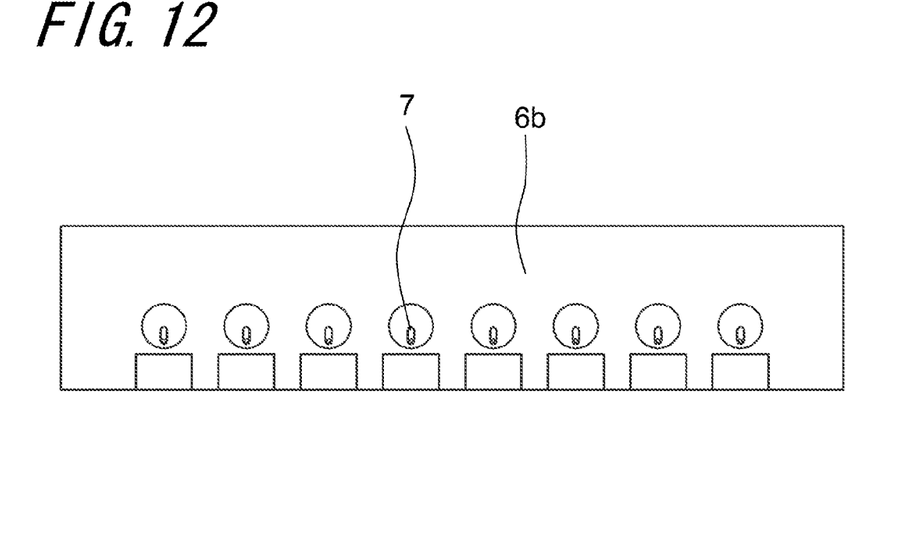
FIG. 12 is a plan view illustrating a relationship between the wiring conductor and the ground layer.

Furthermore, FIG. 7 to FIG. 12 are plan views illustrating a relationship between the wiring conductor 7 and the ground layer 6b, and illustrate the plurality of wiring conductors 7 and a ground pattern of the ground layer 6b. FIG. 7 illustrates the wiring conductor 7 and the ground layer 6b exposed from the notch C. FIG. 8 illustrates a cross section of the wiring conductor 7 and the ground layer 6b positioned in the first non-formation section F1. FIG. 9 illustrates a cross section of the wiring conductor 7 and the ground layer 6b positioned in the second non-formation section F2. FIG. 10 illustrates the wiring conductor 7 and the ground layer 6b connecting a lower section of a first wiring conductor 7a and an upper section of a second wiring conductor 7b. FIG. 11 illustrates a cross section of the wiring conductor 7 and the ground layer 6b positioned in the third non-formation section F3. FIG. 12 illustrates the wiring conductor 7 and the ground layer 6b connecting a lower section of the second wiring conductor 7b and an upper section of a third wiring conductor 7c.

The wiring conductor 7 can form a transmission line inside the input-output terminal 6 by passing through the non-formation region of the plurality of ground layers 6b inside the input-output terminal 6. Then, narrow portions such as the first non-formation section F1, the second non-formation section F2, and the third non-formation section F3 are provided in the ground layer 6b from an upper side toward a lower side so that the return loss does not approach 0 dB rather than a predetermined reference value (for example, −15 dB) with a favorably aligned characteristic impedance $Z_0$. Therefore, for example, it is possible to suppress the return loss from becoming poor while approaching 0 dB rather than the reference value in a high frequency band of more than 30 GHz. Here, the narrow portions of the ground layer 6b are portions at which the non-formation region of layered ground patterns positioned around the wiring conductor 7 extending in the vertical direction are reduced. For example, if the ground layer 6b in which the non-formation region is not changed is provided around the wiring conductor extending straight in the vertical direction, the return loss becomes poor in the high frequency band of more than 30 GHz, and the resonance frequency is also generated at appropriately 30 GHz. Thus, by reducing the distance between the ground layer 6b and the wiring conductor 7 by providing the second non-formation section F2 in the input-output terminal 6, the return loss can be away from 0 dB than the reference value even at the frequency of 30 GHz, and the insertion loss can be maintained in a state of approaching 0 dB. Then, in the mounting structure body 1 according to the embodiment, by shifting the resonance frequency to further high frequency side in the high frequency band, it is possible to set the resonance frequency to approximately 44 GHz and to achieve favorable frequency characteristics.

The wiring conductor 7 is exposed on the upper surface of the notch C. Then, the wiring conductor 7 exposed on the upper surface of the notch C is electrically connected to an electrode of the element 3 or to electric wiring formed on the upper surface of the seat 3a by, for example, the bonding wire. The wiring conductor 7 extends into the input-output terminal 6 from the upper surface of the notch C. Furthermore, the wiring conductor 7 extends to the lower surface of the input-output terminal 6 passing through the input-output terminal 6. Then, the element 3 is electrically connected to the input-output terminal 6 through the wiring conductor 7. Moreover, if the first wiring conductor 7a, the second wiring conductor 7b, and the third wiring conductor 7c are circular cylindrical, the diameter of the wiring conductor 7 inside the input-output terminal 6 is, for example, set to be 0.1 mm or more and 0.2 mm or less. At this time, the dielectric constant of the dielectric layer 6a is 8.6.

The wiring conductor 7 includes the first wiring conductor 7a passing through the input-output terminal 6 in the vertical direction, the second wiring conductor 7b having the upper section electrically connected to the lower section of the first wiring conductor 7a and passing through the input-output terminal 6 which is closer to the outside of the frame body 5 than the first wiring conductor 7a, and the third wiring conductor 7c having the upper section electrically connected to the lower section of the second wiring conductor 7b and passing through the input-output terminal 6 in the vertical direction which is closer to the outside of the frame body 5 than the second wiring conductor 7b. By dividing the wiring conductor 7 extending in the vertical direction inside the input-output terminal 6 into plural pieces and tiering the plural pieces of wiring conductor 7 and by cutting the wiring conductor 7 so as to have a short length in the vertical direction, it is possible to suppress the increase of the resonance generated in the wiring conductor 7 inside the input-output terminal 6 in the vertical direction and to shift the resonance of whole of the wiring conductor 7a to the side of the high frequency inside the input-output terminal 6 in the vertical direction.

Furthermore, the length of the first wiring conductor 7a in the vertical direction is set to be longer than the length of the second wiring conductor 7b in the vertical direction and the length of the third wiring conductor 7c in the vertical direction. Furthermore, the length of the second wiring conductor 7b in the vertical direction is set to be longer than the length of the third wiring conductor 7c in the vertical direction. Since the length of the first wiring conductor 7a in the vertical direction is set to be longer than the length of the second wiring conductor 7b in the vertical direction and the length of the third wiring conductor 7c in the vertical direction, and the length of the second wiring conductor 7b in the vertical direction is set to be longer than the length of the third wiring conductor 7c in the vertical direction, in the wiring conductor 7 between the lead terminal 8 and the element 3, it is possible to quickly convert the signal from the lead terminal 8 to a coaxial mode by the third wiring conductor 7c, to smoothly reduce the deviation from the reference value of the characteristic impedance by the second wiring conductor 7b, and to achieve a transmission form of the coaxial mode in which the resonance is suppressed by the first wiring conductor 7a.

Furthermore, the first non-formation section F1 and the second non-formation section F2 are provided corresponding to the plurality of dielectric layers 6a in which the first wiring conductor 7a is provided. That is, the first non-formation section F1 and the second non-formation section F2 are positioned inside a plurality of layers in which the first wiring conductor 7a is formed. By changing the area of the non-formation region of the ground layer 6b formed on the plurality of dielectric layers 6a corresponding to the first wiring conductor 7a, it is possible to change only the ground pattern of the ground layer 6b with respect to the first wiring conductor 7a which extends straight inside the input-output terminal 6 in the vertical direction. Then, portions in which the distance between the wiring conductor 7 and the ground layer 6b is complicatedly changed are decreased and the electric signal passing through the wiring conductor 7 is unlikely to be shifted from a predetermined reference value, for example, from the characteristic impedance of 50 Ω.

Moreover, in the first non-formation section F1, the distance between the wiring conductor 7 and the ground layer 6b is, for example, set to be 0.54 mm or more and 0.6 mm or less. Furthermore, in the second non-formation section F2, the distance between the wiring conductor 7 and the ground layer 6b is, for example, set to be 0.364 mm or more and 0.556 mm or less. Furthermore, in the third non-formation section F3, the distance between the wiring conductor 7 and the ground layer 6b is, for example, set to be 0.54 mm or more and 0.6 mm or less.

A seal ring 9 is continuously provided along the frame section 5a of the frame body 5 through the brazing material. The seal ring 9 is configured to provide the connection with a lid body 10 when providing the lid body 10 so as to cover the inside of the frame body 5. Moreover, the seal ring 9 is formed of a metal material such as copper, tungsten, iron, nickel, or cobalt, or an alloy containing a plurality of types of these metal materials which are excellent in a seam welding property with the lid body 10. Moreover, a thermal expansion coefficient of the seal ring 9 is, for example, set to be $4 \times 10^{-6}$/K or more and $16 \times 10^{-6}$/K or less.

Furthermore, the lid body 10 is disposed on the seal ring 9 so as to cover the element 3 inside the frame body 5. The lid body 10 is configured to hermetically seal the region surrounded by the frame body 5. For example, the lid body 10 is formed of a metal material such as copper, tungsten, iron, nickel, or cobalt, or an alloy containing a plurality of types of these metal materials, or ceramics such as an aluminum oxide sintered body, a mullite sintered body, a silicon carbide sintered body, an aluminum nitride sintered body, a silicon nitride sintered body, or glass ceramics. Furthermore, the lid body 10 is bonded to the seal ring 9 through for example, bonding using seam welding or using a bonding member such as solder or a brazing material.

The region surrounded by the frame body 5 is in a vacuum or filled with nitrogen gas or the like, and it is possible to put the region surrounded by the frame body 5 in a hermetically sealed state by disposing the lid body 10 on the seal ring 9. The lid body 10 is positioned on the seal ring 9 at a predetermined atmosphere and is attached to the seal ring 9 by performing seam welding. Furthermore, for example, the lid body 10 can be attached through a bonding material such as a brazing material, a glass bonding material, or a resin bonding material.

In the mounting structure body 1 and the element housing package 2 according to the embodiment, the plurality of ground layers 6b each have a circular non-formation region in a plan view thereof, a part of the wiring conductor 7 passing through the input-output terminal 6 in the vertical direction is provided in the non-formation region, and the non-formation region has the first non-formation section F1, the second non-formation section F2 having an area smaller than that of the first non-formation section F1, and the third non-formation section having an area larger than that of the second non-formation section F2 in the downward direction from above. As described above, by providing the region in which the distance between the ground layer 6b and the wiring conductor 7 is decreased inside the input-output terminal 6, it is possible to shift the resonance frequency to further higher frequency side in the high frequency band and to achieve favorable frequency characteristics at 30 GHz to approximately 42 GHz.

The invention is not limited to the embodiment described above, and various modifications, improvements, and the like are possible without departing from the scope of the invention. Moreover, in the embodiment described above, the non-formation region is circular, but the invention is not limited to the embodiment. The shape of the non-formation region may be, for example, elliptical, rectangular, polygonal, or the like as long as favorable frequency characteristics of the element housing package is achieved.

Figure 13:
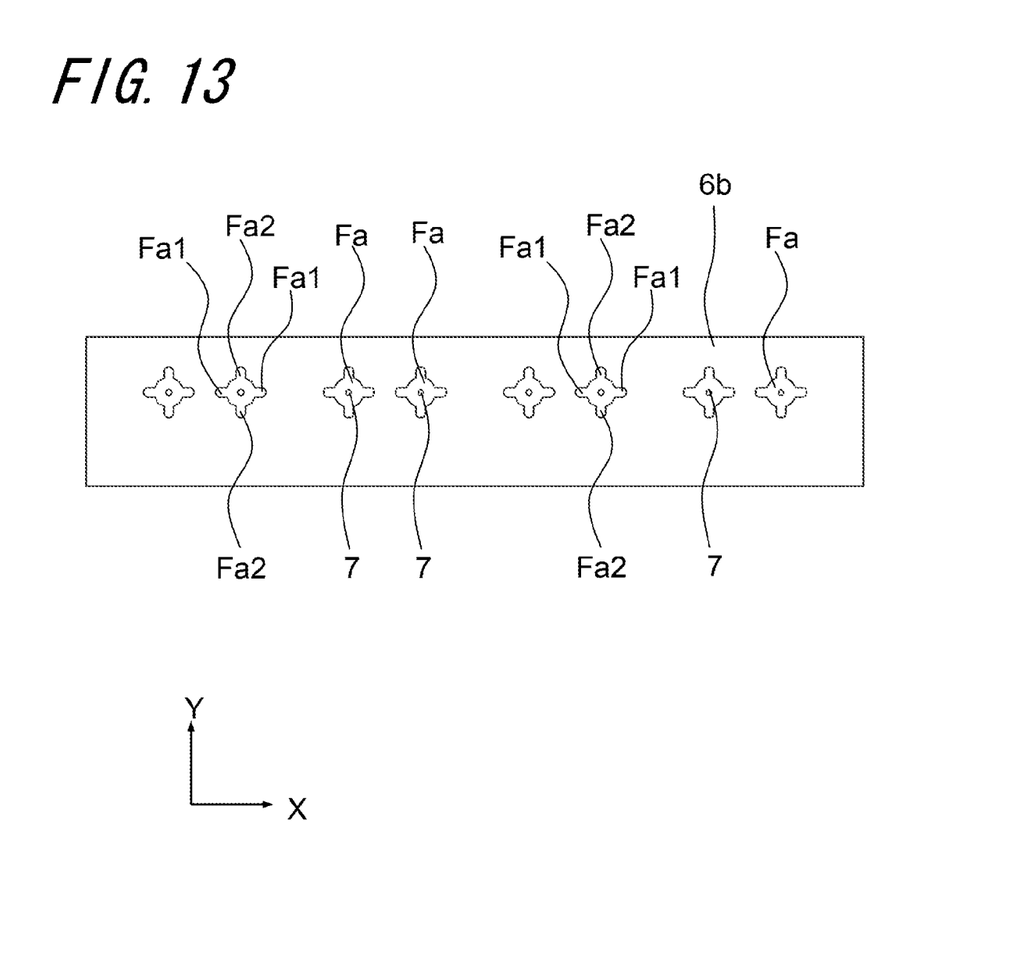
FIG. 13 is a plan view illustrating a relationship between a wiring conductor and a ground layer according to one modified example.

Specifically, as illustrated in FIG. 13, the shape of the non-formation region may be a shape having a circular section and convex sections extending in four directions from the circular section. A non-formation region Fa, in a plan view thereof, has first protrusion sections Fa1 protruding respectively from the non-formation region of the circular section to both sides in an X direction and second protrusion sections Fa2 protruding respectively to both sides in a Y direction. Furthermore, since the non-formation region of the element housing package according to the modified example has a cross shape, it is possible to adjust an electrostatic capacitance generated between the wiring conductor 7 and the ground layer 6b and the characteristic impedance of the wiring conductor 7 to an arbitrary value using the first protrusion sections Fa1 and the second protrusion sections Fa2 without increasing the radius of the non-formation region Fa that is formed in the circular shape except for the first protrusion sections Fa1 and the second protrusion sections Fa2. Furthermore, the first protrusion sections Fa1 and the second protrusion sections Fa2 are disposed axisymmetrically about the wiring conductor 7 as a central axis. Therefore, the wiring conductor 7 and the non-formation region Fa are approximated to an axisymmetric coaxial line, and the wiring conductor 7 can favorably transmit the high-frequency signal. Then, it is possible to achieve further favorable frequency characteristics in the high frequency band in the mounting structure body 1. Moreover, if the first protrusion sections Fa1 and the second protrusion sections Fa2 are not disposed axisymmetrically about the wiring conductor 7 as the central axis, the wiring conductor 7 and the non-formation region Fa are unlikely to be approximated to the coaxial line, and the frequency characteristic of the wiring conductor 7 will be decreased. Therefore, the wiring conductor 7 can favorably transmit the high-frequency signal by disposing the first protrusion sections Fa1 and the second protrusion sections Fa2 axisymmetrically about the wiring conductor 7 as the central axis.

Furthermore, as illustrated in FIG. 13, in the modified example, the first protrusion sections Fa1 protrude respectively to both sides in the X direction (a horizontal direction in a plane of paper) and second protrusion sections Fa2 protrude respectively to both sides in the Y direction (a vertical direction in the plane of paper), but the invention is not limited to the modified example. That is, the first protrusion sections Fa1 may protrude respectively in any first direction orthogonal to the vertical direction of a stacked body and the second protrusion sections Fa2 may protrude respectively in any second direction orthogonal to the vertical direction of the stacked body and the first direction. Moreover, the non-formation region Fa is not specifically limited as long as the non-formation region Fa has the circular section and has the first protrusion sections Fa1 protruding from the circular section in the X direction and the second protrusion sections Fa2 protruding in the Y direction in a plan view thereof.

Furthermore, in the embodiment described above, the shape of the first wiring conductor 7a, the second wiring conductor 7b, and the third wiring conductor 7c inside the input-output terminal 6 is circular cylindrical, but the invention is not limited to the embodiment. The first wiring conductor 7a, the second wiring conductor 7b, and the third wiring conductor 7c may be, for example, formed in a rectangular cylindrical shape, a polygonal cylindrical shape, or the like.

<Manufacturing Method of Mounting Structure Body>

Here, a manufacturing method of the mounting structure body 1 illustrated in FIG. 1 or 2 will be described. First, the element housing package 2 and the element 3 are prepared. The substrate 4 and the frame body 5 of the element housing package 2 are made into predetermined shapes by performing a well-known metal processing method such as rolling or punching of an ingot formed by casting and solidifying a molten metal material in a mold. Furthermore, the input-output terminal 6 is made by the manufacturing method described above.

Then, the substrate 4 and the input-output terminal 6 are connected to each other through the brazing material. Furthermore, the light-permeable member 5c is fitted into and connected to the penetrating section 5b of the frame body 5 through the brazing material. Thusly, it is possible to prepare the element housing package 2. Furthermore, the seat 3a is provided in the mounting region R of the element housing package 2 through the brazing material. Furthermore, the element 3 is mounted on the seat 3a, and the electrode of the element 3 and the wiring conductor 7 of the input-output terminal 6 inside the frame body 5 are electrically connected to each other through the electric wiring or bonding wire provided on the seat 3a. Furthermore, the seal ring 9 and the lid body 10 are attached to the element housing package 2, and thereby it is possible to prepare the mounting structure body 1.

The invention claimed is:

1. An element housing package, comprising:
   a substrate having a mounting region for mounting an element on an upper surface thereof;
   a frame body having a frame section disposed on the substrate to surround the mounting region along an outer periphery of the substrate, the frame section being provided with a penetrating section formed in a direction which is along the upper surface of the substrate; and
   an input-output terminal disposed in the penetrating section and electrically connecting an inside of the frame body and an outside of the frame body,
   the input-output terminal having a wiring conductor formed in a stacked body consisting of a plurality of dielectric layers and a plurality of ground layers which are alternately laminated, to extend from a part of an upper surface of the stacked body which is positioned inside the frame body, through an inside of the stacked body, to a part of a lower surface thereof which is positioned outside the frame body, and a lead terminal connected to the wiring conductor in the lower surface of the stacked body,
   a non-formation region being provided in at least three ground layers around the wiring conductor, which passes through in a vertical direction of the stacked body, the non-formation region including, in order from an upper side toward a lower side of the stacked body, a first non-formation section, a second non-formation section having an area smaller than that of the first non-formation section, and a third non-formation section having an area larger than that of the second non-formation section.

2. The element housing package according to claim 1, wherein the wiring conductor has a first wiring conductor passing through the stacked body in the vertical direction, a second wiring conductor having an upper section electrically connected to a lower section of the first wiring conductor and passing through a part of the stacked body in the vertical direction which is closer to an end surface of the stacked body on the outside of the frame body than the first wiring conductor, and a third wiring conductor having an upper section electrically connected to a lower section of the second wiring conductor and passing through the part of the stacked body in the vertical direction which is closer to the end surface than the second wiring conductor.

3. The element housing package according to claim 2, wherein a length of the first wiring conductor in the vertical direction is longer than that of the second wiring conductor in the vertical direction and that of the third wiring conductor in the vertical direction, and
wherein the length of the second wiring conductor in the vertical direction is longer than that of the third wiring conductor in the vertical direction.

4. The element housing package according to claim 2, wherein the first non-formation section and the second non-formation section are positioned inside the plurality of ground layers in which the first wiring conductor is formed.

5. The element housing package according to claim 1, wherein the non-formation region has a first protrusion section protruding in a first direction orthogonal to the vertical direction of the stacked body, and a second protrusion section protruding in a second direction orthogonal to the vertical direction of the stacked body and the first direction, in a plan view thereof.

6. A mounting structure body, comprising:
the element housing package according to claim 1; and
an element mounted on the mounting region of the element housing package.

7. A mounting structure body, comprising:
the element housing package according to claim 2; and
an element mounted on the mounting region of the element housing package.

8. A mounting structure body, comprising:
the element housing package according to claim 3; and
an element mounted on the mounting region of the element housing package.

9. A mounting structure body, comprising:
the element housing package according to claim 4; and
an element mounted on the mounting region of the element housing package.

10. A mounting structure body, comprising:
the element housing package according to claim 5; and
an element mounted on the mounting region of the element housing package.

* * * * *